(12) United States Patent
Kim et al.

(10) Patent No.: US 9,330,921 B2
(45) Date of Patent: May 3, 2016

(54) SEMICONDUCTOR DEVICE AND METHOD OF MANUFACTURING THE SAME

(71) Applicant: Semiconductor Manufacturing International (Shanghai) Corporation, Shanghai (CN)

(72) Inventors: Bongkil Kim, Shanghai (CN); Chuanmiao Zhou, Shanghai (CN); Bing Guo, Shanghai (CN); Xiaoyan Zhao, Shanghai (CN)

(73) Assignee: SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 14/626,794

(22) Filed: Feb. 19, 2015

(65) Prior Publication Data

US 2015/0287731 A1    Oct. 8, 2015

(30) Foreign Application Priority Data

Apr. 3, 2014    (CN) .......................... 2014 1 0133597

(51) Int. Cl.
| H01L 29/788 | (2006.01) |
| H01L 21/28 | (2006.01) |
| G11C 16/04 | (2006.01) |
| H01L 29/66 | (2006.01) |
| H01L 27/115 | (2006.01) |

(52) U.S. Cl.
CPC .......... *H01L 21/28035* (2013.01); *G11C 16/04* (2013.01); *H01L 27/11521* (2013.01); *H01L 29/66659* (2013.01); *H01L 29/66825* (2013.01); *H01L 29/7881* (2013.01)

(58) Field of Classification Search
CPC ............ H01L 27/115; H01L 27/11524; H01L 27/11529; H01L 29/7881; H01L 27/42328
USPC ........................... 257/314–321; 438/257–267
See application file for complete search history.

(56) References Cited

U.S. PATENT DOCUMENTS

| 2003/0127684 A1* | 7/2003 | Yoo et al. ....................... 257/316 |
| 2012/0146123 A1* | 6/2012 | Da et al. ......................... 257/316 |
| 2014/0024183 A1* | 1/2014 | Hsu et al. ....................... 438/241 |

* cited by examiner

*Primary Examiner* — Brook Kebede
(74) *Attorney, Agent, or Firm* — Innovation Counsel LLP

(57) ABSTRACT

A semiconductor device is provided. The semiconductor device includes a semiconductor substrate, and a memory cell disposed on the semiconductor substrate. The memory cell includes a selection transistor and a memory transistor. The selection transistor includes a selection gate, a first source, and a first drain. The memory transistor includes a floating gate, a control gate, a second source, a second drain, and a first insulating layer disposed between the floating gate and the control gate. The semiconductor device further includes a selection gate sidewall spacer disposed near an edge of a bit line of the selection gate of the selection transistor. The selection gate sidewall spacer is separated from the selection gate by a second insulating layer. The selection gate sidewall spacer and the control gate are formed of a first material.

15 Claims, 5 Drawing Sheets

SEMICONDUCTOR DEVICE AND METHOD OF MANUFACTURING THE SAME

CROSS-REFERENCE TO RELATED APPLICATION

This application claims priority to Chinese Patent Application No. 201410133597.7 filed on Apr. 3, 2014, the disclosure of which is incorporated herein by reference in its entirety.

BACKGROUND

1. Technical Field

The present disclosure relates to the field of semiconductor technology, and more particularly to a semiconductor device and method of manufacturing the same.

2. Description of the Related Art

In the field of semiconductor technology, electrically erasable programmable read-only memory (EEPROM) is a type of non-volatile storage device that is widely used in computers, mobile phones and other electronic devices.

In high-speed and low operating voltage (Vcc) applications, an EEPROM cell typically requires a highly negative programming pulse (PGM) threshold voltage (Vt). For example, a negative PGM Vt may range from $-0.5V$ to $-1.5V$, and a highly negative PGM Vt may be less than $-1.5V$. From a design standpoint, there are two ways to achieve a highly negative PGM Vt. The first way is to increase the duration of the programming pulse, but this is often incompatible with back-end system end-customer (end-CTM) applications. The second way is to use a high programming voltage (Vpp) to increase the programming pulse (PGM) voltage. From a process standpoint, the second way typically requires a high bit line (BL) junction breakdown voltage (junction bvdss). Specifically, the junction breakdown voltage (junction bvdss) refers to the breakdown voltage at a junction node formed between the bit line (BL) and a connection point disposed beneath the BL. The bit line (BL) junction breakdown voltage may be adjusted and optimized using additional processing such as ion implantation, thermal budget optimization, or by adding a high-voltage (HV) spacer.

Therefore, in the prior art, additional processing is required to achieve an EEPROM unit that has a highly negative programming pulse (PGM) threshold voltage (Vt), and that is able to meet back-end system (end-CTM) applications. However, the additional processing usually increases the process complexity and costs of manufacturing the EEPROM unit.

SUMMARY

The present disclosure addresses at least the above deficiencies in the prior art. Specifically, the present disclosure provides a semiconductor device that has a highly negative programming pulse (PGM) threshold voltage (Vt), and that can be used in high-speed and low operating voltage (Vcc) applications.

According to one embodiment of the inventive concept, a semiconductor device is provided. The semiconductor device includes a semiconductor substrate, and a memory cell disposed on the semiconductor substrate. The memory cell includes a selection transistor and a memory transistor. The selection transistor includes a selection gate, a first source, and a first drain. The memory transistor includes a floating gate, a control gate, a second source, a second drain, and a first insulating layer disposed between the floating gate and the control gate. The semiconductor device further includes a selection gate sidewall spacer disposed near an edge of a bit line of the selection gate of the selection transistor. The selection gate sidewall spacer is separated from the selection gate by a second insulating layer. The selection gate sidewall spacer and the control gate are formed of a first material.

In one embodiment, the first material may include polysilicon.

In one embodiment, the selection gate sidewall spacer and the control gate may be formed simultaneously.

In one embodiment, the first insulating layer and the second insulating layer may be formed of a same insulating layer.

In one embodiment, the selection transistor and the memory transistor may be formed having a common source configuration.

In one embodiment, the selection gate and the floating gate may be formed of a second material.

In one embodiment, the second material may include polysilicon.

In one embodiment, the selection gate sidewall spacer may be disposed covering an upper portion of the selection gate.

In one embodiment, the semiconductor device may include an electrically erasable programmable read-only memory (EEPROM).

According to another embodiment of the inventive concept, a method of manufacturing a semiconductor device is provided. The method includes: providing a semiconductor substrate; forming a selection gate of a selection transistor and a floating gate of a memory transistor on the semiconductor substrate; forming an insulating layer covering the floating gate and the selection gate; and depositing and etching a gate material layer to form a control gate of the memory transistor and a selection gate sidewall spacer, wherein the selection gate sidewall spacer is disposed near an edge of a bit line of the selection gate of the selection transistor.

In one embodiment, the selection gate sidewall spacer and the control gate may be formed of polysilicon.

In one embodiment, the selection gate and the floating gate may be formed of a same material.

In one embodiment, the selection gate and the floating gate may be formed of polysilicon.

In one embodiment, the selection gate and the floating gate may be formed simultaneously.

In one embodiment, the selection gate sidewall spacer may be disposed covering an upper portion of the selection gate.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

DETAILED DESCRIPTION

Figure 1:
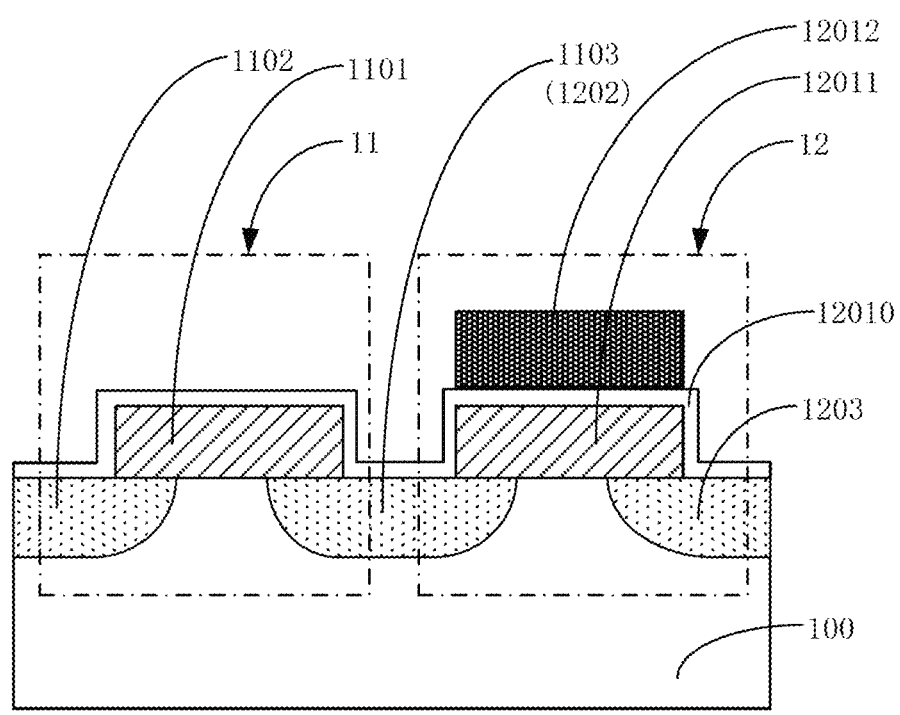
FIG. 1 depicts a schematic cross-sectional view of an EEPROM.

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

A semiconductor device according to an embodiment of the inventive concept may be an EEPROM, and may also include other devices besides the EEPROM.

FIG. 1 illustrates the structure of an EEPROM. Referring to FIG. 1, the EEPROM includes a semiconductor substrate 100 and a memory cell disposed on the semiconductor substrate 100. The memory cell includes a selection transistor 11 and a memory transistor 12. The selection transistor 11 includes a selection gate (SG) 1101, a source 1102, and a drain 1103. The memory transistor 12 includes a floating gate (FG) 12011, a control gate (CG) 12012, a source 1202, a drain 1203, and an insulating layer 12010 disposed between the floating gate (FG) 12011 and the control gate (CG) 12012. In most instances (not shown), the EEPROM further includes a bit line connected to the source 1102 of the selection transistor 11.

Next, an exemplary semiconductor device will be described with reference to FIG. 2. The semiconductor device includes a semiconductor substrate 100 and a memory cell disposed on the semiconductor substrate 100. The memory cell includes a selection transistor 11 and a memory transistor 12. The selection transistor 11 includes a selection gate (SG) 1101, a source 1102, and a drain 1103. The memory transistor 12 includes a floating gate (FG) 12011, a control gate (CG) 12012, a source 1202, a drain 1203, and an insulating layer 12010 disposed between the floating gate (FG) 12011 and the control gate (CG) 12012. In some embodiments, the EEPROM further includes a bit line connected to the source 1102 of the selection transistor 11.

The embodiment of FIG. 2 differs from the EEPROM of FIG. 1 as follows. In the embodiment of FIG. 2, the semiconductor device further includes a selection gate side-wall spacer 11011 disposed near an edge of the bit line of the selection gate 1101 of the selection transistor 11. The selection gate side-wall spacer 11011 is separated from the selection gate 1101 by the insulating layer 12010. In one embodiment, the selection gate side-wall spacer 11011, and the control gate (CG) 12012 of the memory transistor 12, may be made of a same material, for example, polysilicon. Since the selection gate side-wall spacer 11011 and the control gate (CG) 12012 are made of the same material, the selection gate side-wall spacer 11011 and the control gate (CG) 12012 can thus be formed simultaneously using the same process (i.e. without requiring additional process steps).

In some embodiments, the selection gate side-wall spacer 11011 and the selection gate 1101 may be separated by another insulating layer (that is different from the insulating layer 12010). In some embodiments, a bottom portion of the selection gate side-wall spacer 11011 may be formed in direct contact with the semiconductor substrate 100. In some other embodiments, the selection gate side-wall spacer 11011 may be separated from the semiconductor substrate 100 by an insulating layer.

In the semiconductor device according to an embodiment, since the selection gate side-wall spacer 11011 is disposed near an edge of the bit line and is disposed in contact with the semiconductor substrate 100, the junction breakdown voltage (junction bvdss) of the bit line can be increased, thereby improving the programming pulse threshold voltage.

In one embodiment, the selection transistor 11 and the memory transistor 12 may be formed having a common source configuration. For example, the drain 1103 of the selection transistor 11, and the source 1202 of the memory transistor 12, may be used by both the selection transistor 11 and the memory transistor 12, as shown in FIG. 2. The common source configuration uses less area on the semiconductor substrate 100, and therefore reduces the form factor of the semiconductor device.

In one embodiment, the selection gate 1101 of the selection transistor 11 and the floating gate (FG) 12011 of the memory transistor 12 may be made of the same material, for example, polysilicon.

In one embodiment, the selection gate side-wall spacer 11011 is formed covering an upper portion of the selection gate 1101. In particular, by covering the upper portion of the selection gate 1101 with the selection gate side-wall spacer 11011, the junction breakdown voltage (junction bvdss) of the bit line can be increased.

It should be noted that the exemplary semiconductor device is not limited to the above-described embodiments. For example, in some other embodiments, the semiconductor device may include word lines and other components.

Figure 2:
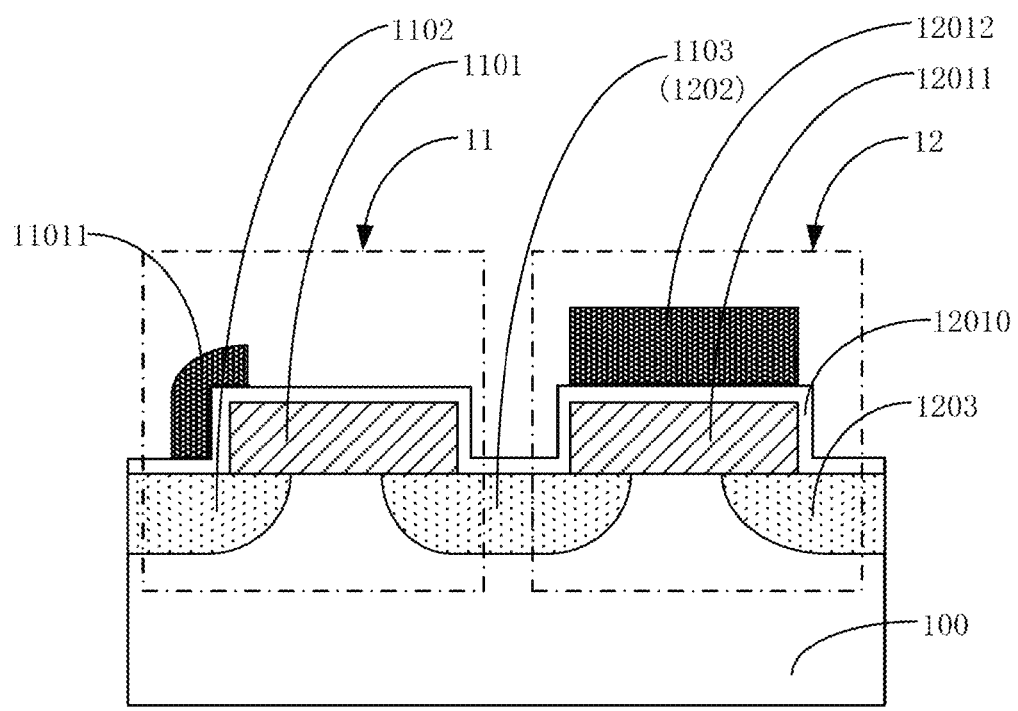
FIG. 2 depicts a schematic cross-sectional view of a semiconductor device according to an embodiment.
Figure 3:
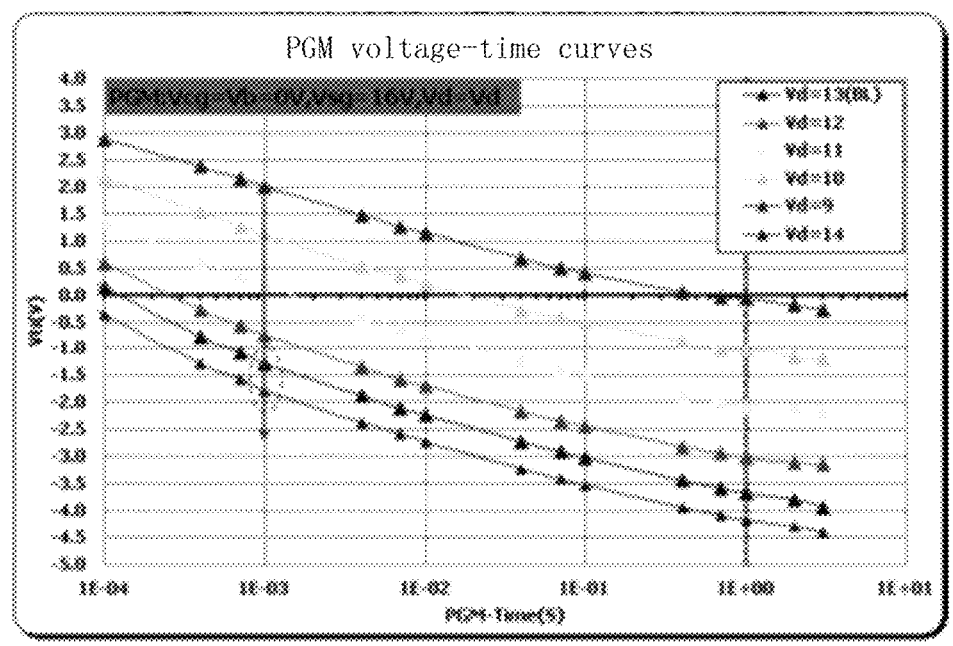
FIG. 3 is a plot of the PGM voltage-time curves for the embodiment of FIG. 2 and the EEPROM of FIG. 1.

FIG. 3 is a plot of the PGM voltage-time curves for the embodiment of FIG. 2 and the EEPROM of FIG. 1. The PGM voltage-time curves can be obtained from experimental results. As shown by the dotted circled region in FIG. 3, the programming pulse threshold voltage (negative programming pulse) in the embodiment of FIG. 2 is greater than the programming pulse threshold voltage of the EEPROM of FIG. 1 by about 0.5 V. Accordingly, the embodiment of FIG. 2 is more suited to high-speed and low operating voltage applications compared to the EEPROM of FIG. 1.

Figure 4:
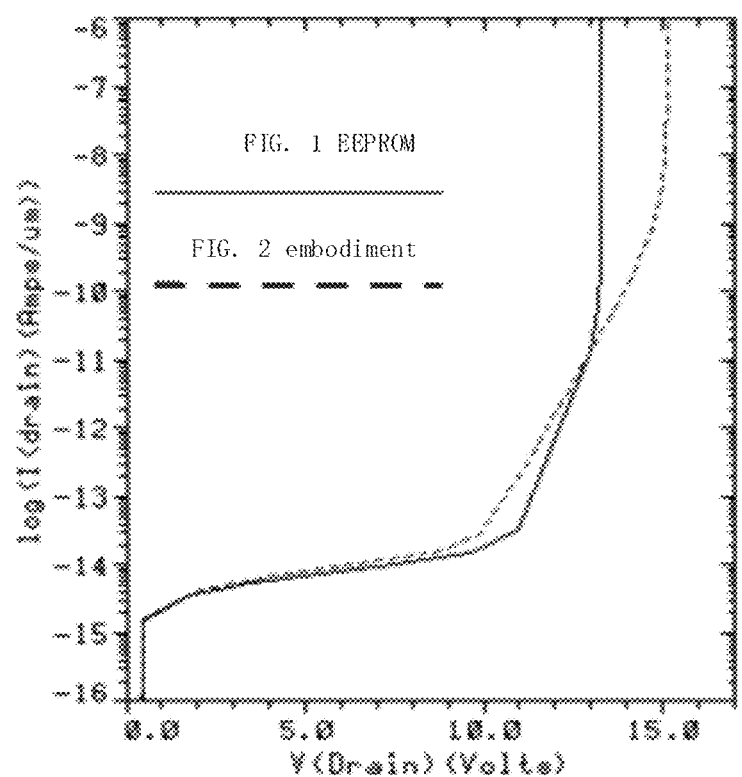
FIG. 4 is a comparison of the experimental results of the bit line junction breakdown voltage between the embodiment of FIG. 2 and the EEPROM of FIG. 1.

FIG. 4 illustrates a comparison of the experimental results of the bit line junction breakdown voltage between the embodiment of FIG. 2 and the EEPROM of FIG. 1. Referring to the FIG. 4, the bit line junction breakdown voltage of the embodiment of FIG. 2 is greater than the bit line junction breakdown voltage of the EEPROM of FIG. 1 by about 2V, which gives the programming voltage (Vpp) a voltage margin of about 1V, and thus provides significant improvement to the programming pulse threshold voltage. Accordingly, the embodiment of FIG. 2 has a higher negative (improved) programming pulse threshold voltage compared to the EEPROM of FIG. 1. Accordingly, the exemplary semiconductor device may be used in high-speed and low operating voltage applications.

According to the above embodiment of the inventive concept, the semiconductor device includes the selection gate side-wall spacer 11011. The selection gate side-wall spacer 11011 is disposed near an edge of the bit line of the selection gate 1101 of the selection transistor 11, and in contact with the semiconductor substrate 100. The selection gate side-wall spacer 11011 is also made of the same material as the control gate (CG) 12012. Accordingly, the junction breakdown voltage (junction bvdss) of the bit line can be increased, thereby improving the negative programming pulse (PGM) threshold voltage (Vt) of the EEPROM unit. Compared to the prior art, the exemplary semiconductor device has higher bit line breakdown voltage, and also higher negative programming pulse (PGM) threshold voltage (Vt). Accordingly, the exemplary semiconductor device may be used in high-speed and low operating voltage (Vcc) applications.

Next, a method of manufacturing a semiconductor device according to an embodiment will be described in detail with reference to FIG. 5. The method includes the following steps.

In Step A1, a semiconductor substrate is provided. A selection gate (SG) of a selection transistor and a floating gate (FG) of a memory transistor are formed on the semiconductor substrate. The selection gate (SG) and the floating gate (FG) may be made of a same material and formed using a same process. For example, the selection gate (SG) and the floating gate (FG) may be made of polysilicon or other appropriate materials. However, the inventive concept is not limited thereto. In some alternative embodiments, the selection gate (SG) and the floating gate (FG) may be fabricated in different process steps. In those alternative embodiments, the selection gate (SG) and the floating gate (FG) may be made of a same material or different materials.

In Step A2, an insulating layer is formed covering a floating gate (FG) of the memory transistor and a selection gate of the selection transistor. In one embodiment, a same insulating layer is formed covering the floating gate (FG) and the selection gate. In an alternative embodiment, different insulating layers are forming covering the floating gate (FG) and the selection gate. In those alternative embodiments, a first insulating layer may be formed covering the floating gate (FG) and a second insulating layer may be formed covering the selection gate.

In Step A3, a gate material layer is deposited and etched to form a control gate (CG) of the memory transistor and a selection gate sidewall spacer. The selection gate sidewall spacer is disposed near an edge of a bit line of the selection gate of the selection transistor. In one embodiment, the gate material layer may be made of polysilicon. Nevertheless, it should be noted that the control gate and the selection gate sidewall spacer may be made of other appropriate materials.

In one embodiment, the selection gate sidewall spacer may be disposed covering an upper portion of the control gate.

A method of manufacturing a semiconductor device according to an embodiment has been described above with reference to Steps A1 through A3. However, the inventive concept is not limited to the above and may include additional semiconductor processing steps known to those skilled in the art. The additional steps may include steps for forming sources, drains, bit lines, etc. Since the additional steps are known to those skilled in the art, a detailed description of those steps will be omitted. Furthermore, it should be noted that some of the above steps may be omitted or modified in various ways by those skilled in the art.

A semiconductor device formed using the above exemplary method includes forming the selection gate sidewall spacer at the same time when forming the control gate (CG) of the memory transistor. The selection gate sidewall spacer is disposed near an edge of a bit line of the selection gate of the selection transistor. As a result, no additional processing step is required to form the selection gate sidewall spacer. Also, the selection gate sidewall spacer may be made of the same material as the control gate (CG). Accordingly, the junction breakdown voltage (Junction bvdss) of the bit line can be increased, thereby improving the negative programming pulse (PGM) threshold voltage (Vt) of the EEPROM unit.

Figure 5:
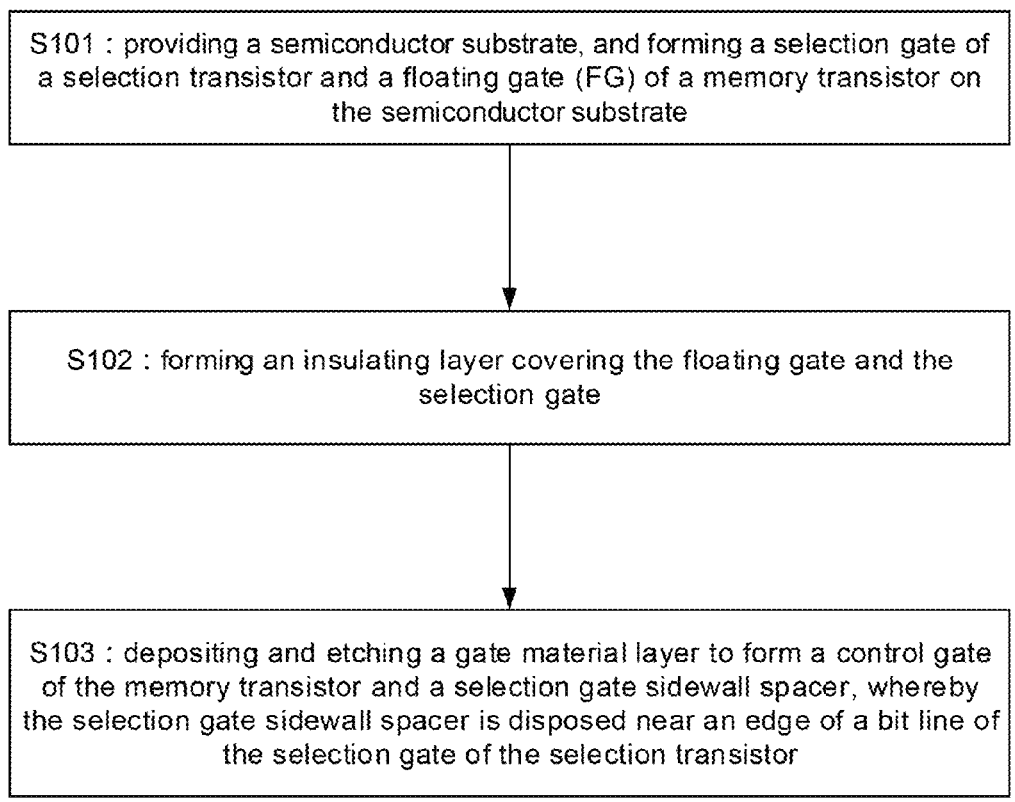
FIG. 5 is a flowchart illustrating a method of manufacturing a semiconductor device according to an embodiment.

FIG. 5 is a flowchart illustrating a method of manufacturing a semiconductor device according to an embodiment. The method of FIG. 5 may include some or all of the previously-described Steps A1 through A3. Specifically, the method of FIG. 5 includes the following steps.

Step S101: providing a semiconductor substrate, and forming a selection gate of a selection transistor and a floating gate (FG) of a memory transistor on the semiconductor substrate.

Step S102: forming an insulating layer covering the floating gate and the selection gate.

Step S103: depositing and etching a gate material layer to form a control gate of the memory transistor and a selection gate sidewall spacer. The selection gate sidewall spacer is disposed near an edge of a bit line of the selection gate of the selection transistor.

It is noted that the semiconductor device of FIG. 2, or a semiconductor device manufactured using the method of FIG. 5, may be incorporated into an electronic apparatus. As previously mentioned, the exemplary semiconductor devices have higher bit line breakdown junction voltage and higher negative programming pulse (PGM) threshold voltage (Vt) compared to the semiconductor devices in the prior art. Therefore, the electronic apparatus including the exemplary semiconductor devices would inherit the above desirable characteristics. The exemplary semiconductor devices can be formed on an integrated circuit that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices.

Embodiments of a semiconductor device and a method of manufacturing the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

Different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A semiconductor device comprising:
   a semiconductor substrate;
   a memory cell disposed on the semiconductor substrate, wherein the memory cell includes a selection transistor disposed on a first region of the semiconductor substrate and a memory transistor disposed on a second region of the semiconductor substrate, wherein the first region and the second region are spaced apart by a third region of the semiconductor substrate,
   the selection transistor including a selection gate, a first source, and a first drain disposed on the third region of the semiconductor substrate,
   the memory transistor including a floating gate, a control gate disposed over the floating gate, a second source disposed on the third region of the semiconductor substrate, a second drain, and a first insulating layer disposed between the floating gate and the control gate; and
   a selection gate sidewall spacer disposed near an edge of a bit line of the selection gate of the selection transistor, wherein the selection gate sidewall spacer is separated from the selection gate by a second insulating layer, and wherein the selection gate sidewall spacer and the control gate are formed of a first material.

2. The semiconductor device according to claim 1, wherein the first material includes polysilicon.

3. The semiconductor device according to claim 1, wherein the selection gate sidewall spacer and the control gate are formed simultaneously.

4. The semiconductor device according to claim 1, wherein the first insulating layer and the second insulating layer are formed of a same insulating layer.

5. The semiconductor device according to claim 1, wherein the selection transistor and the memory transistor are formed having a common source configuration.

6. The semiconductor device according to claim 1, wherein the selection gate and the floating gate are formed of a second material.

7. The semiconductor device according to claim 6, wherein the second material includes polysilicon.

8. The semiconductor device according to claim 1, wherein the selection gate sidewall spacer is disposed covering an upper portion of the selection gate.

9. The semiconductor device according to claim 1, wherein the semiconductor device includes an electrically erasable programmable read-only memory (EEPROM).

10. A method of manufacturing a semiconductor device, comprising:
    providing a semiconductor substrate;
    forming a selection gate of a selection transistor on a first region of the semiconductor substrate;
    forming a floating gate of a memory transistor on a second region of the semiconductor substrate;
    forming a first insulating layer covering the floating gate and the selection gate;
    forming a control gate of the memory transistor over the floating gate; and
    forming a selection gate sidewall spacer near an edge of a bit line of the selection gate of the selection transistor,
    wherein the selection gate sidewall spacer is separated from the selection gate by a second insulating layer, and
    wherein a first drain of the selection transistor and a second source of the memory transistor are disposed on a third region of the semiconductor substrate.

11. The method according to claim 10, wherein the selection gate sidewall spacer and the control gate are formed of polysilicon.

12. The method according to claim 10, wherein the selection gate and the floating gate are formed of a same material.

13. The method according to claim 12, wherein the selection gate and the floating gate are formed of polysilicon.

14. The method according to claim 12, wherein the selection gate and the floating gate are formed simultaneously.

15. The method according to claim 10, wherein the selection gate sidewall spacer is disposed covering an upper portion of the selection gate.

* * * * *